United States Patent [19]

Rose et al.

[11] Patent Number: 5,449,914
[45] Date of Patent: Sep. 12, 1995

[54] IMAGING ELECTRON ENERGY FILTER

[75] Inventors: Harald Rose; Stephan Uhlemann, both of Darmstadt; Eugen Weimer, Essingen, all of Germany

[73] Assignee: Carl-Zeiss-Stiftung, Heidenheim, Germany

[21] Appl. No.: 218,343

[22] Filed: Mar. 25, 1994

[30] Foreign Application Priority Data

Mar. 26, 1993 [DE] Germany .................. 43 10 559.9

[51] Int. Cl.[6] ........................................... H01J 37/14
[52] U.S. Cl. .......................... 250/396 ML; 250/311; 250/305
[58] Field of Search .......... 250/305, 396 R, 396 ML, 250/311

[56] References Cited

U.S. PATENT DOCUMENTS

| | | | |
|---|---|---|---|
| 4,314,218 | 2/1982 | Trone | 250/396 ML |
| 4,322,622 | 3/1982 | Trone | 250/396 ML |
| 4,553,029 | 11/1985 | Matsuda | 250/396 R |
| 5,177,361 | 1/1993 | Krahl et al. | 250/396 ML |
| 5,319,207 | 6/1994 | Rose et al. | 250/396 R |
| 5,336,885 | 8/1994 | Rose et al. | 250/305 |

Primary Examiner—Bruce C. Anderson
Attorney, Agent, or Firm—Walter Ottesen

[57] ABSTRACT

The invention relates to an electron energy filter for electron microscopes as well as to an electron microscope equipped with such a filter. The filter comprises three sector magnets with the deflection field in the first sector magnet being homogeneous. The deflection field in each of the two other sector magnets is an inhomogeneous gradient field. To generate the gradient field, the pole pieces of the two other sector magnets have the form of segments of truncated double cones. The electron beam passes the first homogeneous sector magnet twice. Multipole elements are arranged in front of, behind and between the three sector magnets. The filter has a large dispersion also for high-energy electrons while at the same time providing a compact configuration. All second-order aberrations and the significant second-rank aberrations are corrected by means of the multiple elements.

13 Claims, 2 Drawing Sheets

IMAGING ELECTRON ENERGY FILTER

BACKGROUND OF THE INVENTION

Imaging electron filters are used in transmission electron microscopes in order to improve the contrast of the object image or diffraction diagrams by the selection of electrons of a specific energy range. The registration of element distributions and energy loss spectra are also possible with filter systems of this kind.

U.S. Pat. Nos. 4,740,704 and 4,760,261 disclose filter systems which, as dispersive elements, use three or four homogeneous magnetic fields. These filters are of the direct vision kind, that is, the optical axes of the entering and exiting electron paths are coaxial to each other. For this reason, these filters can be well used in electron microscopes wherein the optical axis of the electron paths usually runs vertically from top to bottom for reasons of stability. The input and output edges of the magnetic pole pieces are inclined to the direction of the wavefront of the electron beam for focusing the electrons in the direction of the magnetic deflection fields whereby quadrupole portions are provided which are effective in the direction of the magnetic field.

The dispersion in the energy selective plane of such a spectrometer is approximately 1 to 2 μm per eV at an energy of the electrons of 100 keV. For this reason, energy resolutions of approximately 1 to 2 eV can be adjusted. The dispersion in the homogeneous magnetic fields drops with increasing electron energy. For this reason, filters with significantly larger dimensions are required for adjusting the same energy resolutions for higher electron energies. For use in electron microscopes, this leads to a considerable lengthening of the electron optical column whereby the mechanical stability of this column is reduced. Furthermore, the geometric imaging aberrations increase at the same time since, for filters having larger dimensions, off-axis rays are lead further away from the optical axis than for filters having a smaller dimension.

Magnetic spectrometers having inhomogeneous deflection fields are, for example, disclosed in the article of James S. O'Connell entitled "Simple Broad-Range Magnetic Spectrometer" published in The Review of Scientific Instruments, Vol. 32. No. 12, December 1961, pages 1314 to 1316 where they are described with respect to the field of electron spectroscopy. The spectrometer has a single sector magnet having pole piece faces inclined toward each other. The gradient field resulting therefrom additionally affects, in addition to beam deflection, a focusing perpendicular to the plane of the electron beam axis. In this spectrometer, the optical axes are, however, not coaxial to each other when entering into or exiting from the filter. This leads to unstable total configurations when used in electron microscopes.

The use of spectrometers with inhomogeneous deflection fields in electron microscopes is, for example, suggested in the article of X. Jiye el al entitled "A Study of an Inhomogeneous Gradient Magnetic Field Spectrometer with a Curvolincar Axis", published in Optik, Vol. 71, No. 2 (1985), pages 73 to 79. This work, however, relates essentially to paths in magnetic fields having different inhomogeneity. Specific suggestions for the configuration of such filters cannot be derived therefrom.

The use of two inhomogeneous deflection fields in electron beam apparatus is suggested in an article of the journal Optik, volume 38, (1973) starting at page 502 and in the article of E. Plies entitled "Korrektur der Öffnungsfehler elektronenoptischer Systeme mit krummer Achse und durchgehend astigmatismusfreien Gaußschen Bahnen" published in Optik, Vol. 40 (1974), pages 141 to 160. This system, however, only corrects aperture aberrations. Here also, the optical axes of the electron beams are not coaxial to each other before the entry into the first deflection field and after exiting from the second deflection field.

SUMMARY OF THE INVENTION

It is an object of the invention to provide a magnetic electron energy filter which permits a compact configuration also at higher electron energies such as over 120 keV while at the same time having a high energy resolution.

For this purpose, an imaging electron energy filter is suggested which comprises several sector magnets for beam deflection. At least a first sector magnet has a homogeneous deflection field and at least a second sector magnet has an inhomogeneous deflection field.

Relatively large deflection angles can be realized by utilizing inhomogeneous deflection fields with the deflection angles being able to assume values greater than 120°. The dispersion increases with the path length within the deflection fields. For this reason, the dispersion is correspondingly great at large deflection angles without it being necessary to have larger curvature radii and therefore larger dimensions. A further reduction of the dimensions is possible in that one sector magnet has a deflection field which is essentially homogeneous. The electron beam can pass through this homogeneous deflection field twice in different directions.

For the configuration of the sector magnets with inhomogeneous deflection fields, it is especially advantageous to provide two magnets each having two pole pieces which consist of truncated segments of a double cone. A rotation symmetrical radial wedge-shaped gap extending outwardly is formed between the two faces of the pole pieces.

An advantageous embodiment of the invention includes a first sector magnet having a homogeneous deflection field and two additional sector magnets having respective inhomogeneous deflection fields. In this way, field-free spaces are provided between the sector magnets in which multipole elements can be mounted for correcting second-order imaging aberrations.

An especially compact arrangement results when the distances between the sector magnets and the deflection angles are selected in a manner that the optical axis of the entering and exiting electrons in the homogeneous deflection field touches itself or crosses over itself twice. In this way, the distance between the filter input and the filter output is minimized.

The optical axis of the electron paths when entering into and when exiting from the filter should run coaxially with respect to itself when the energy electron filter is used in an electron microscope. In this way, the filter is optimally adapted to the assembly of the electron microscope which is usually vertical for reasons of stability.

The sector magnets are preferably mounted so as to be symmetrical to a plane which is perpendicular to the plane in which the curved optical axis runs. When the electrons pass through the entire filter, half of second-order aberrations and some third-order aberrations already vanish because of reasons of symmetry.

The electron energy filter of the invention is especially easy to produce when the pole piece edges of the sector magnets are straight at the entry and exit faces of the electron beam. Furthermore, the entry and exit angles between the optical axis and the pole piece edges of the sector magnet should be 90° for each of the following: at the first entry into the homogeneous deflection field, at the entrance into and when exiting from the inhomogeneous deflection fields and for the last exit from the homogeneous deflection field. In this way, diffractions of the electron beam when entering and when exiting from the magnetic fields are avoided. Thus, the path is relatively smooth and no focusing effects occur at the edges of the sector magnets. In this way, the filter is relatively insensitive against misalignments.

The multipole lenses are provided for correcting imaging aberrations and are arranged symmetrically to the symmetry plane for maintaining the symmetry adjusted by the symmetrical arrangement of the sector magnets. Each two multipole lenses, which are mounted symmetrically with respect to each other, can be identically excited by a common control.

A multipole lens is mounted in front of the entry image plane in front of the first sector magnet and a multipole lens is mounted behind of the exit image plane symmetrical to the entry image plane, that is, the exit image plane of the filter per se. This pair of multipole lenses comprises a quadrupole and a hexapole mutually superimposed. The quadrupole field and the hexapole field are adjustable independently of each other. Focusing in the direction perpendicular to the mid section of the filter can be adjusted as desired by varying the quadrupole lenses in combination with the quadrupole field in the inhomogeneous sector magnet, which is constant along the path in the sector magnet. The hexapole fields operate, in turn, in the same manner as the hexapole fields mounted between the individual sector magnets, to correct image aberrations.

An energy filter is provided by suitably positioning the multipole elements along the electron path with a total of seven hexapoles between the entry image plane of the filter and the exit image plane of the filter together with the two multipoles arranged near by the entry image plane and the exit image plane. One of the seven hexapoles is mounted in the symmetry plane between the second and third sector magnet. The energy filter provided in this configuration is corrected with respect to all geometric image aberrations and with respect to the energy-dependent aberrations of second rank which are significant in each particular operating mode. The entry image plane is then stigmatically and achromatically imaged with high resolution in the exit image plane of the filter. Furthermore, the distortions of the third order of the filter disappear because of reasons of symmetry.

The spacing between the image planes and the crossover planes is of significance for the use of the electron energy filter in combination with an electron microscope and especially with respect to a transmission electron microscope. More specifically, the spacing referred to here is the spacing between the entry image plane and the entry diffraction plane as well as the spacing between the exit image plane and the exit diffraction plane is adapted to the spacings pregiven by the electron optical imaging system of the electron microscope.

The external quadrupoles have furthermore the advantage that an astigmatism caused by possible assembly errors can be corrected.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
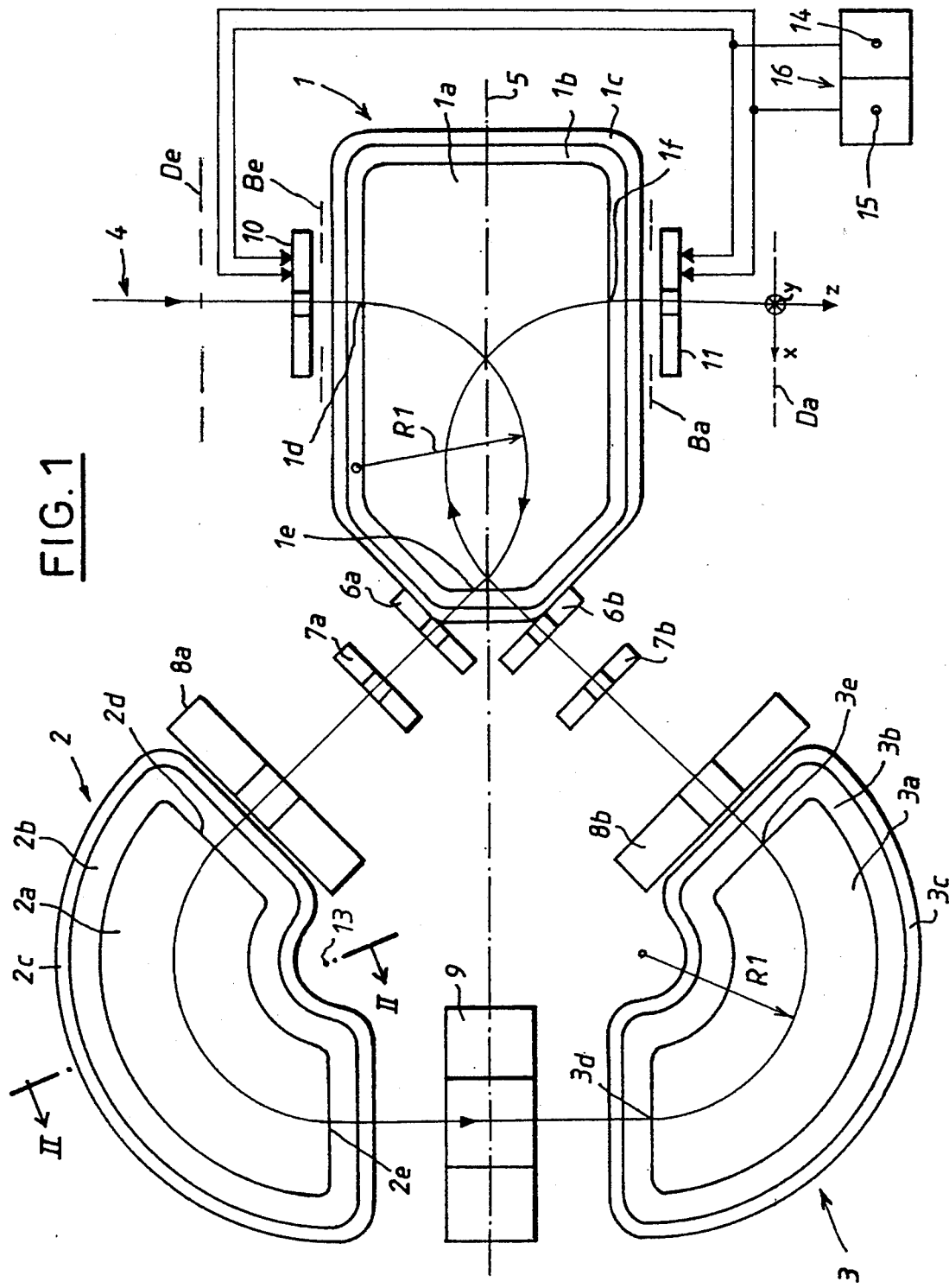
FIG. 1 is a section view taken through a preferred embodiment of the filter according to the invention in a plane in which the optical axis lies; and, FIG. 2 is a section view taken through a sector magnet along line II—II of FIG. 1 and shows the pole piece faces inclined toward each other.

The electron energy filter shown in FIG. 1 comprises three sector magnets (1, 2, 3) for which only the projection of the respective pole pieces (1a, 2a, 3a) are shown lying beneath the plane of the drawing. The optical axis of the filter is identified by reference numeral 4. This optical axis 4 is identical with the central ray of the electron beam for a pregiven desired energy. The precise path for an individual electron depends on the respective electron energy because of the dispersion in the sector magnets and is not shown here for reasons of clarity.

The central electron beam (optical axis 4) enters the electron energy filter from above along a vertical axis. The filter can be installed in a transmission electron microscope (not shown) having an electron path running vertically from above to below. When the electron energy filter is installed in such a microscope, the optical axis 4 of the filter is coincident with the optical axis of the electron microscope when entering and exiting from the filter. The entry image plane Be is coincident with an intermediate image plane of the electron microscope and the entry diffraction plane De is coincident with a diffraction plane of the electron microscope. The precise arrangement of the filter at the imaging side of the electron microscope can be as described in U.S. Pat. No. 4,812,652 which is herein incorporated by reference.

The pole pieces 1a of the first sector magnet have planar parallel pole piece faces in the interior thereof. The pole pieces (2a, 3a) of the two other sector magnets (2, 3) are truncated tapered bodies. Peripheral slots (1b, 2b, 3b) are formed in the edge regions of the pole pieces (1a, 2a, 3a) for receiving the excitation coils (not shown). The stray fields occurring outside of the sector magnets are greatly reduced by seating the excitation coils in the slots (1b, 2b, 3b) and by the peripheral edge regions (1c, 2c, 3c) which are produced thereby.

A homogeneous deflection field is generated in the first sector magnet 1. For this purpose, the sector magnet 1 includes two pole pieces having planar pole piece faces which are arranged in planes parallel to the plane of the drawing in FIG. 1. An electron beam enters along the optical axis 4 perpendicular to the entry edge 1d of the deflection field with the desired energy. This electron beam is deflected between the pole pieces 1a to a circular path having a radius of curvature R1 by the magnetic field perpendicular to the intermediate plane. The optical axis 4 forms approximately a circular arc segment over an angle of about 135° between the entry at the entry edge 1d and the exit at the exit edge 1e. The optical axis of the electron beam passing from the first sector magnet is therefore deflected through a deflection angle $\phi = 135°$ with respect to the optical axis of the entering electron beam. The path length of the electron beam within the first deflection region is relatively large for a pregiven deflection radius R1 because of the relatively large deflection angle $\phi$. Accordingly, the dispersion within the first deflection region is relatively large.

The electron beam is focused in the direction of the magnetic field because of the inclination between the optical axis 4 and the exit edge 1e of the homogeneous sector magnet 1. This focusing action can be generated alternately by additional quadrupoles behind the sector magnet 1 when the optical axis is perpendicular to the exit edge 1e.

After leaving the first deflection field, the electrons first pass through a field-free intermediate space in which three hexapoles (6a, 7a, 8a) are arranged and thereafter enter the deflection field of the second sector magnet 2. The deflection field within the second sector magnet is an inhomogeneous magnetic gradient field which is generated between two pole piece faces (2a, 2f) inclined toward each other as shown in FIG. 2.

Figure 2:
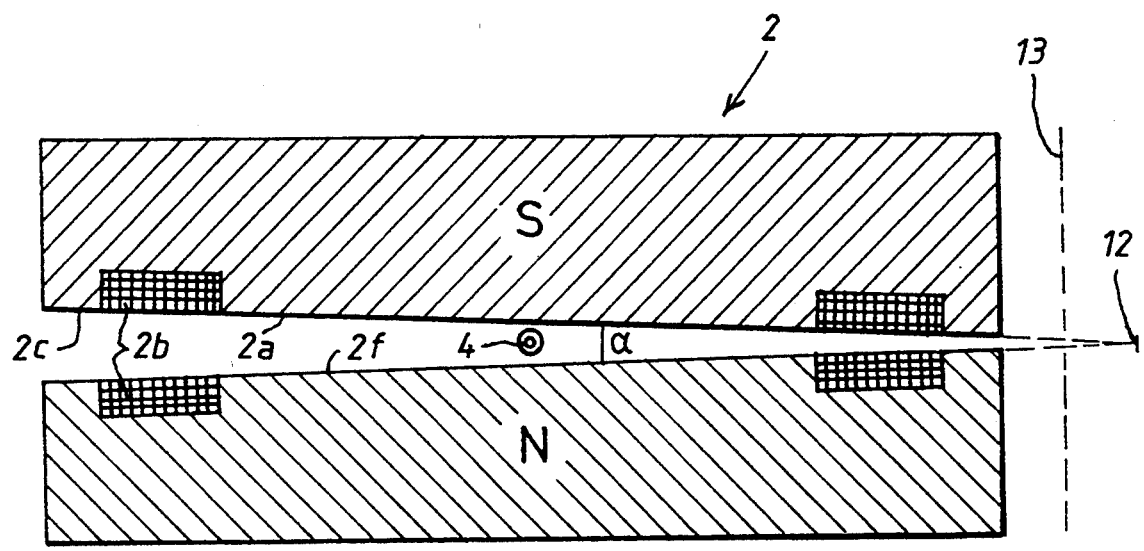
Figure 2:
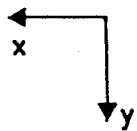

The optical axis of the electron paths is again identified by reference numeral 4 in the sector view of FIG. 2 perpendicular to the plane of the drawing in FIG. 1. The coil bodies seated in the slots 2b of the truncated pole piece faces (2a, 2f) are indicated by cross hatching in FIG. 2. The angle of inclination $\alpha$ between the two slope lines of the tapered faces (2a, 2b) is approximately 4°. The entire sector magnet 2 results from rotation about the axis 13 perpendicular to the plane of the optical axis 4. The intersection point 12 of the two slope lines of the tapered faces (2a, 2f) lies behind the axis 13 when viewed from the optical axis 4.

A gradient field is produced in the wedge-shaped gap conjointly defined by the pole pieces because of the inclination of the two pole piece faces (2a, 2f). The field intensity reduces because of the gap which increases in the outward direction (positive x-direction, see the coordinate systems in FIGS. 1 and 2 which correspond to each other). The gradient field has the effect of a dipole field on which a quadrupole field is superimposed. The dipole field effects a deflection of the electron beam on a circular path segment and a focusing in the x-direction in the same manner as the dipole field of a homogeneous deflection field. The superimposed quadrupole portion additionally effects the focusing of the electron beam in the y-direction perpendicular to the plane of the drawing in FIG. 1.

As shown in FIG. 1, the optical axis 4 is perpendicular to the entry edge 2d when entering the second deflection field at the entry edge and is perpendicular to the exit edge 2e when exiting from the second deflection field. After exiting from the second deflection field, the optical axis of the electron beam runs in a direction parallel to the optical axis before entering the first deflection field. The optical axis then passes through the likewise inhomogeneous gradient field of the third sector magnet 3 and thereafter passes a second time through the homogeneous deflection field of the first sector magnet 1 from which the electron beam exits at the exit edge 1f.

The entire filter is built up symmetrically to a center plane 5 perpendicular to the mid section of the filter (plane of the drawing in FIG. 1). Therefore the configuration of the third sector magnet 3 results from the configuration of the second sector magnet 2 by mirroring at the symmetry plane 5. Between the third sector magnet 3 and the first sector magnet 1, three additional hexapoles (8b, 7b, 6b) are mounted with respect to the symmetry plane 5 so as to be symmetrical to the hexapoles (8a, 7a, 6a). A further hexapole 9 is mounted between the second sector magnet 2 and the third sector magnet 3 in the symmetry plane 5. A real intermediate image of the entry image plane Be lies at this location.

Two additional multipole elements (10, 11) are arranged in front of and near by the entry image plane Be of the filter and behind the exit image plane Ba symmetrically with respect to the symmetry plane 5. Each of the latter multipole elements (10, 11) comprises a superposition of a quadrupole and a hexapole. The quadrupole and hexapole can be excited independently of each other via adjusting potentiometers 14 and 15 and a corresponding control unit schematically represented by block 16. The electron energy filter images the entry image plane Be stigmatically and achromatically into the exit image plane Ba. At the same time, the filter images the entry diffraction plane De dispersively into the exit diffraction plane Da. The spacings between the individual sector magnets (1, 2, 3) are adapted to the deflection angle (being identical in the three deflection regions) in such a manner that the optical axis intersects itself twice in the first sector magnet 1. In this way, the distance between the entry image plane Be and the exit image plane Ba is especially small measured along the optical axis of the electron microscope. The electron optical column of the microscope is therefore insignificantly lengthened by building in the filter according to the invention and the mechanical stability of the entire system is not significantly influenced in a negative manner.

The significant aberrations in the dispersive diffraction plane can be corrected without changing the fields generated in the multipole components (10, 11). In total, all geometric image aberrations of the second order and the significant energy-dependent errors of the second rank can be corrected by appropriately adjusting the nine multipole components (6a, 7a, 8a, 9, 8b, 7b, 6b, 10, 11).

Since the entire filter assembly is symmetrical to the center plane 5, not all multipole components must be, however, separately drivable. Instead, multipole elements arranged symmetrical to each other as well as the second and third sector magnets can be energized via a common current control in order to avoid a complexity which can be too great with respect to apparatus and an adjustment effort which is too intensive.

The filter has excellent correction characteristics and a relatively high dispersion exists at high electron energies. For these reasons, the filter provides an excellent energy resolution in the image when inserting a selection slit into the exit diffraction plane Da. At an electron energy of 200 keV, the total dispersion of the filter still amounts to approximately 10 $\mu$m per eV so that energy resolutions of $\pm 0.1$ eV can be adjusted with a selection slit having a width of 1 $\mu$m. The influence of the axial chromatic aberration of the objective of the electron microscope which damps the phase contrast transfer functions can be reduced by zero-loss filtering with high energy resolution. This leads to an improvement of the resolution and an improvement of the image contrast. The gain in resolution for uncorrected objectives can amount to approximately 20% and for spherically corrected objectives the gain in resolution can be up to a factor of three.

The filter is also especially insensitive to misalignments because of the smooth path especially because of the avoidance of diffractions at the edges of the sector magnets.

It is understood that the foregoing description is that of the preferred embodiments of the invention and that various changes and modifications may be made thereto without departing from the spirit and scope of the invention as defined in the appended claims.

What is claimed is:

1. An imaging electron energy filter comprising:
    a plurality of sector magnets for deflecting a beam;
    a first one of said sector magnets being configured to define a homogeneous deflection field; and,
    a second one of said sector magnets defining an inhomogeneous deflection field.

2. The electron energy filter of claim 1, a third one of said sector magnets also being configured to provide an inhomogeneous deflection field.

3. The electron energy filter of claim 2, said filter having an optical axis which passes through said homogeneous field when entering into and when exiting from said filter; and, said filter being configured so as to cause said optical axis to touch itself in said homogeneous field or cross over upon itself twice in said homogeneous field.

4. The electron energy filter of claim 3, said second and third sector magnets each including two pole pieces having respective mutually adjacent pole faces conjointly defining a gap and said pole faces defining respective slope lines extended to define an intersection point where the extended slope lines mutually intersect; and, said gap becoming increasingly wider with increasing distance from said intersection point.

5. The electron energy filter of claim 4, the pole pieces of each of said second and third magnets being configured so as to cause said pole faces to be configured as segments of truncated double cones.

6. The electron energy filter of claim 5, wherein said optical axis defines a first plane; said optical axis having a first segment which enters said filter and a second segment which exits from said filter; said first and second segments being coaxial; and, said sector magnets being arranged so as to be symmetrical to a second plane perpendicular to said first plane.

7. The electron energy filter of claim 6, each of said sector magnets having a straight entry edge and a straight exit edge; and, wherein said optical axis is at 90° to the respective entry edges of said second and third sector magnets when entering the corresponding inhomogeneous deflection fields thereof; said optical axis is at 90° to the respective exit edges of said second and third sector magnets when exiting from the corresponding inhomogeneous deflective fields thereof; and, said optical axis is at 90° to the exit edge of said first sector magnet when said optical axis exits from said homogeneous deflection field.

8. The electron energy filter of claim 6, said second plane being a plane of symmetry for said filter; and, said filter further comprising a plurality of multipole lenses arranged outside of said magnetic deflection fields and symmetrically to said second plane; said multipole lenses being grouped into pairs and the multipole lenses of each pair being symmetrically arranged with respect to said second plane; and, the multipole lenses of each pair being coupled to each other with respect to their excitation.

9. The electron energy filter of claim 8, wherein said filter has an entry image plane adjacent the entry edge of said first sector magnet and an exit image plane adjacent the exit edge of said first sector magnet; said entry image plane and said exit image plane being mutually symmetrical; and, said filter further comprising a first additional multipole lens being arranged upstream of said entry image plane and a second additional multipole lens arranged downstream of said exit image plane; each of said additional multipole lenses including a quadrupole and a hexapole mutually superposed; and, means for adjusting said quadrupole and said hexapole independently of each other.

10. The electron energy filter of claim 8, wherein said multipole lenses are configured as hexapoles.

11. The electron energy filter of claim 2, wherein the deflection angle in each of said deflection fields is greater than 90°.

12. The electron energy filter of claim 2, wherein the deflection angle in each of said deflection fields is greater than 135°.

13. In an electron microscope wherein an electron beam is generated and transmitted along an optical axis in a predetermined direction, an imaging electron energy filter comprising:
    a plurality of sector magnets for deflecting a beam;
    a first one of said sector magnets being configured to define a homogeneous deflection field; and,
    a second one of said sector magnets defining an inhomogeneous deflection field.

* * * * *

UNITED STATES PATENT AND TRADEMARK OFFICE
CERTIFICATE OF CORRECTION

PATENT NO. : 5,449,914

DATED : September 12, 1995

INVENTOR(S) : Harald Rose, Stephan Uhlemann and Eugen Weimer

It is certified that error appears in the above-identified patent and that said Letters Patent is hereby corrected as shown below:

In the title page, item [56], under "U.S. PATENT DOCUMENTS", insert the following:
-- 4,740,704   4/1988   Rose et al
   4,760,261   7/1988   Rose et al
   4,812,652   3/1989   Egle et al --.

In the title page, item [56], insert the following:
     -- FOREIGN PATENT DOCUMENTS
3,532,698   3/1987   Germany --.

In the title page, item [56], insert the following:
--           OTHER PUBLICATIONS "The double focusing iron-core electron spectrometer 'Bill' for high resolution (n, e⁻) measurements at the high flux reactor in Grenoble" by W. Mampe et al, Nuclear Instruments and Methods, Volume 154, No. 1, August 1978, pages 127 to 149.

"A compact aberration-free imaging filter with inside energy selection" by Ralf Degenhardt et al, Nuclear Instruments and Methods in Physics, Section A, Volume 298, No. 1/3, December 1, 1990, pages 171 to 178.

"Simple Broad-Range Magnetic Spectrometer" by J. O'Connell, The Review of Scientific Instruments, Vol. 32, No. 12, Dec. 1961, pages 1314 to 1316.

"A study of an inhomogeneous Gradient Magnetic Field Spectrometer with a Curvilinear Axis" by X. Jiye et al, Optik, Vol. 71, 1985, pages 73 to 79.

UNITED STATES PATENT AND TRADEMARK OFFICE
CERTIFICATE OF CORRECTION

PATENT NO. : 5,449,914

DATED : September 12, 1995

INVENTOR(S) : Harald Rose, Stephan Uhlemann and Eugen Weimer

It is certified that error appears in the above-identified patent and that said Letters Patent is hereby corrected as shown below:

"Korrektur der Öffnungsfehler elektronenoptischer Systeme mit krummer Achse und durchgehend astigmatismusfreien Gaußschen Bahnen" by E. Piles, Optik, Vol. 40, 1974, pages 141 to 160. --

In column 1, line 61: delete "curvolincar" and substitute -- section -- therefor.

Signed and Sealed this

Nineteenth Day of December, 1995

*Attest:*

BRUCE LEHMAN

*Attesting Officer*     Commissioner of Patents and Trademarks